United States Patent [19]
O'Sullivan

[11] Patent Number: 6,043,695
[45] Date of Patent: Mar. 28, 2000

[54] PHASE LOCKED LOOP USING A SCHMITT TRIGGER BLOCK

[75] Inventor: Eugene O'Sullivan, Tokyo, Japan

[73] Assignee: NEC Corporation, Tokyo, Japan

[21] Appl. No.: 09/086,225

[22] Filed: May 28, 1998

[30] Foreign Application Priority Data

May 29, 1997 [JP] Japan ................................. 9-140289

[51] Int. Cl.[7] ..................................................... H03L 7/06
[52] U.S. Cl. .......................... 327/157; 327/156; 331/1 A; 331/17
[58] Field of Search .................................... 327/155, 156, 327/157; 331/1 A, 17, 25, 111, 153

[56] References Cited

U.S. PATENT DOCUMENTS

| | | | |
|---|---|---|---|
| 4,555,679 | 11/1985 | Katsuyama | 331/17 |
| 5,274,338 | 12/1993 | Rieger et al. | 331/111 |
| 5,372,046 | 12/1994 | Kleven et al. | 327/552 |
| 5,576,647 | 11/1996 | Sutardja et al. | |

FOREIGN PATENT DOCUMENTS 583 586  2/1994  European Pat. Off. .
647 032  4/1995  European Pat. Off. .

*Primary Examiner*—Timothy P. Callahan
*Assistant Examiner*—An T. Luu

[57] ABSTRACT

A phase locked loop (PLL) circuit is described which uses a Schmitt trigger block (28) to achieve a very small steady state phase error at an input of a phase comparator block (21) over the entire PLL lock voltage range. The amount of hysteresis which each Schmitt trigger circuit (281, 282) in the Schmitt trigger block (28) has depends on the damping factor $\zeta$ of the PLL circuit as well as the temperature and voltage coefficients of a VCO's input voltage. The midpoint of the positive and the negative thresholds of the hysteresis curve of each Schmitt trigger circuit (281, 282) is set by the current voltage characteristics of charge pump circuits in a charge pump block (22). Responsive to the PLL's lock voltage (VCNT), the Schmitt trigger block (28) commands a control logic circuit (29) to turn ON or turn OFF as the case may be PMOS pump UP transistors to that of NMOS pump DOWN transistors. It is this ratio which determines the PLL's steady state phase error. In one embodiment, a frequency divider (25) is used between the VCO (24) and the phase comparator block (21). In another embodiment, this divider (25) is removed and the output of the VCO is fed directly back to the phase comparator block.

14 Claims, 13 Drawing Sheets

FULL SWING BUFFER INVERTERS:44A-44H
PUMP TRANSISTORS:MP1,MN1,MP2,MN2

PHASE LOCKED LOOP USING A SCHMITT TRIGGER BLOCK

BACKGROUND OF THE INVENTION

This invention relates to a phase locked loop circuit using a Schmitt trigger where in response to a VCO input control voltage adjusts an aspect ratio of pump UP transistors to that of pump DOWN transistors in a charge pump circuit block to achieve a very small steady state phase error at an input of a phase comparator block Phase locked loop circuits are very important building blocks in data transmission systems. They are used in many different applications for example to eliminate skew between communicating chips, to recover a clock signal from random input data, or to frequency multiply a low frequency signal to a high frequency one.

Various phase locked loop circuits of the type are already known. One example is an article which is contributed by Hiromi Notani et al. to 1994 Symposium on VLSI Circuits Digest of Technical Papers, pages 129–130, under the title of "A 622-MHz CMOS Phase-Locked Loop with Precharge-type Phase Frequency Detector." Another example is disclosed in U.S. Pat. No. 5,576,647 issued to Sutardja et al. under the title of the invention "CHARGE PUMP FOR PHASE LOCKED LOOP."

In the manner which will later be described in conjunction with FIG. 1, a conventional phase locked loop circuit comprises a phase comparator block, a charge pump block, a low-pass filter (LPF) block, a voltage controlled oscillator (VCO), a frequency divider, a reference input terminal, and a timing (clock signal) output terminal.

The phase comparator block compares an input reference signal having a reference frequency to a feedback signal having a divided frequency. A phase difference between the input reference signal and the feedback signal determines phase compared outputs of the phase comparator block. When the phase of the feedback signal leads the phase of the input reference signal, the phase comparator block generates a pulse train of negative pulses as a pump-down signal. The width of those pulses equals the phase difference between the input reference signal and the feedback signal. Conversely when the phase of the feedback signal lags that of the input reference signal, the phase comparator block produces a pulse train of negative pulses as a pump-up signal. The width of these pulses equals the phase difference between the input reference signal and the feedback signal. When there is no phase difference between the input reference signal and the feedback signal, no pulse output is produced.

The phase compared outputs are subsequently supplied to the charge pump block. Depending on the phase compared outputs DN and UP, the charge pump block functions to either charge or discharge an input node of the low-pass filter block. The low-pass filter block is charged when the pump-up signal is low and the pump-down signal is high. Conversely, the low-pass filter block is discharged when the pump-up signal is high and the pump-down signal is low. When both the pump-up signal and the pump-down signal are high, the charge pump block is disabled in which case the low-pass filter block is neither charged nor discharged. In this case, the low-pass filter block is isolated from the charge pump block and the phase comparator block.

Therefore, the charge pump block is basically a tri-state (charging, discharging or open) switch. A charge pump output signal of the charge pump block is converted to a DC (direct current) voltage or a control voltage by means of the low-pass filter block. The low-pass filter block determines the response characteristics of the PLL circuit i.e. a natural frequency $\omega_n$ and a damping factor $\zeta$.

The VCO is supplied with the control voltage and produces an output clock signal (a VCO output signal) having a VCO frequency. The VCO consists of a bias generator and a current controlled oscillator. The VCO output signal varies in a range about multiple of the reference frequency in response to the control voltage. The output clock signal is then frequency divided down by the frequency divider to produce a divided clock signal as the feedback signal having the feedback frequency. Negative feedback operation of the PLL circuit results in the phase difference between the input reference signal and the feedback signal becoming a minimum, the so-called 'phase locked state'.

In the manner which will later be described in conjunction with FIG. 3, a conventional charge pump block comprises a PMOS pump UP transistor and an NNOS pump DOWN transistor. The PMOS pump UP transistor has a source connected to VDD while the NMOS pump DOWN transistor has a source connected to GND. Both of the transistors have drains which are connected together to produce the charge pump output signal. A first inverter provides a necessary inversion of the pump-down signal to produce an inverted pump-down signal DNBAR which drives the gate of the NMOS pump DOWN transistor. Second and third inverters buffer the pump-up signal to produce a buffered pump-up signal which drives the gate of the PMOS pump UP transistor.

When the pump-up and the pump-down signals from the phase comparator block are low and high, respectively, the PMOS pump UP transistor turns ON and delivers a pump UP current as the charge pump output signal. Similarly, when the pump-up signal and the pump-down signal from the phase comparator block are high and low, respectively, the NMOS pump DOWN transistor turns ON and delivers a pump DOWN current as the charge pump output signal.

In the ideal phase-locked condition, there would be no phase difference between the input reference signal and the feedback signal. Hence, both of the pump-up and the pump-down signals would remain high, thereby isolating the input node of the low-pass filter block from the phase comparator block. However, in reality, finite PLL loop gain results in some phase difference always existing between the input reference signal and the feedback signal. This erroneous phase difference causes the charge pump block to either produce a corrective pump-up signal or a corrective pump-down signal. While this is the case, the average pump up current flowing in the PMOS pump UP transistor equals the average pump down current flowing in the NMOS pump DOWN transistor. In order to satisfy this condition, the transistors are ratioed proportionally at Vcp=VDD/2.

In the manner which will later be described in conjunction with FIG. 4, the average pump up current and the average pump down current vary as a function of the PLL lock voltage (the charge pump output signal). While the average pump up current is equal to the average pump down current for the PLL lock voltage which is approximately equal to half of VDD, the bigger the mismatch between the average pump up current and the average pump down current becomes as the PLL lock voltage moves towards either VDD or GND. The bigger the mismatch in currents, the bigger the phase error offset (or steady state phase error as it's called) required as the input of the phase comparator to satisfy the condition of the average pump up current equal to the average pump down current at phase lock, The range of the PLL lock voltage depends on the process condition of the chip at the time of manufacture and VCO design. While conventional NMOS input VCOs have a relatively limited lock voltage range, recently proposed complementary type VCOs (both NMOS input and PMOS input) have a much wider lock voltage range. Hence, conventional charge pump circuits used with these type of VCOs would produce even larger steady state phase errors.

Large steady state phase errors cause for example an increase in error bit rate in a clock recovery circuit or increase the skew between two communicating chips. Furthermore, since most lock detectors use phase differences to detect the locked state, this steady state phase error can cause an erroneous lock detection to occur.

Thus in summary, a phase locked loop circuit is needed which achieves a very small steady state phase error for all values of PLL lock voltage.

SUMMARY OF THE INVENTION

It is therefore an object of the present invention to provide a phase locked loop circuit which uses a Schmitt trigger block to achieve a very small steady state phase error over the entire PLL lock voltage range.

Other objects of this invention will become clear as the description proceeds.

According to this invention, a phase locked loop circuit comprises a phase comparator block for detecting a phase difference between an input reference signal and a feedback signal to produce a phase difference signal indicative of the phase difference and a low-pass filter block for producing a control voltage. Placed between the phase comparator block and the low-pass filter block, a charge pump block charges or discharges the low-pass filer block according to the phase difference signal. Connected to the low-pass filter block, a Schmitt trigger block consists of a plurality of Schmitt trigger circuits. Each Schmitt trigger circuit has the amount of hysteresis which depends on a damping factor $\zeta$ of the PLL circuit as well as temperature and voltage coefficients of the control voltage. A hysteresis curve has the midpoint which is set by a current voltage characteristics of the charge pump block. The Schmitt trigger block produces Schmitt output signals which vary in response to the control voltage. Placed between the Schmitt trigger block and the charge pump block, a control logic circuit produces control output signals which vary in response to the Schmitt output signals. The control output signals command the charge pump block to turn ON or OFF. Connected to the low-pass filter block, a voltage controlled oscillator (VCO) generates a VCO output signal whose frequency is determined by the control voltage. Placed between the voltage controlled oscillator and the phase comparator block, a frequency divider frequency divides the VCO output signal by a division ratio N. The frequency divider produces a divided signal as the feedback signal which is supplied to the phase comparator block.

That is, this invention is directed to a phase locked loop circuit. The phase comparator block detects the phase difference between the input reference signal and the feedback signal. Depending on the phase difference between the input reference signal and the feedback signal, the phase comparator block commands the charge pump block to either charge or discharge the low-pass filter block. The control voltage of the low-pass filter block controls both of the frequency of the VCO and the Schmitt output signals of the Schmitt trigger block. The positive and the negative thresholds of the hysteresis curve of each Schmitt trigger circuit in the Schmitt trigger block are set by the characteristics of charge pump circuits in the charge pump block. In response to the low-pass filter's DC (direct current) output voltage, the Schmitt trigger block commands the control logic circuit to turn ON or turn OFF as the case may be pump UP transistors and pump DOWN transistors in the charge pump block. Depending on the application (e.g. frequency synthesis or clock recovery), the frequency divider may or may not be required in a feedback path between the VCO and the phase comparator block.

DESCRIPTION OF THE PREFERRED EMBODIMENTS

Figure 1:
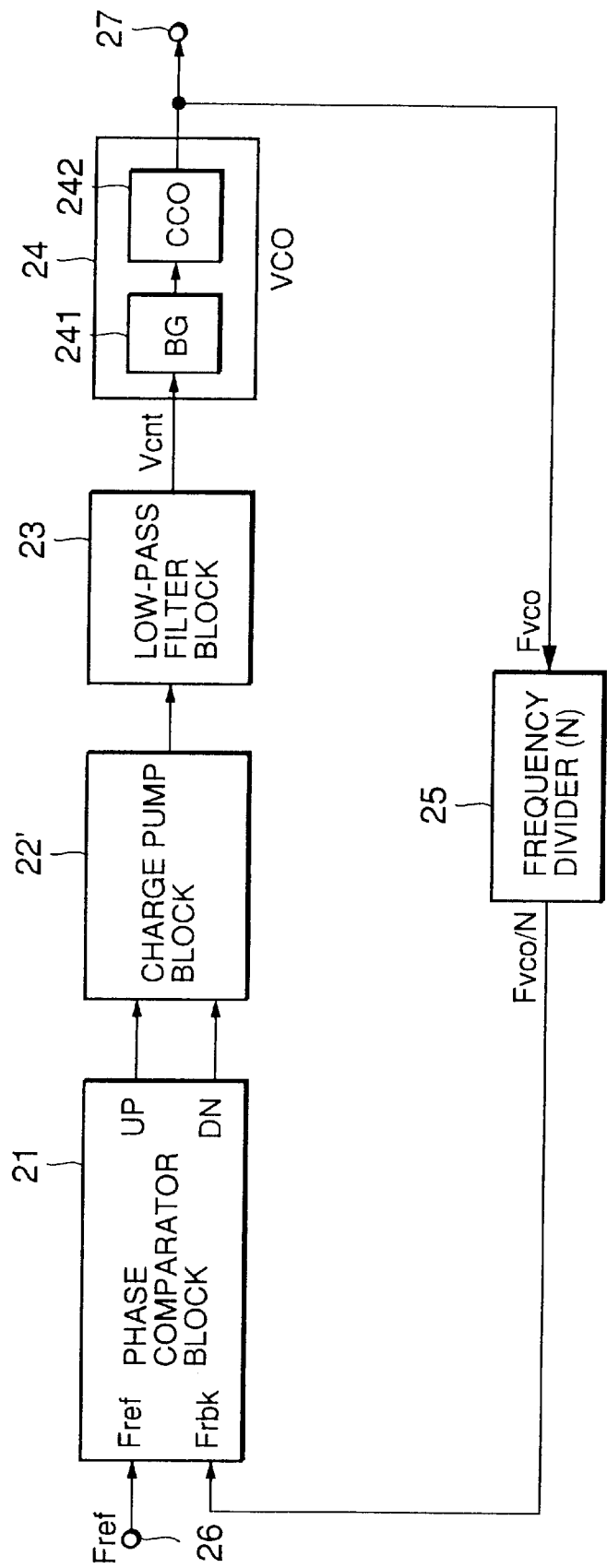
FIG. 1 is a block diagram of a conventional phase locked loop circuit.

Referring to FIG. 1, a conventional phase locked loop circuit will be described at first in order to facilitate an understanding of the present invention. The conventional phase locked loop circuit comprises a phase comparator block 21, a charge pump block 22', a low-pass filter (LPF) block 23, a voltage controlled oscillator (VCO) 24, a frequency divider 25, a reference input terminal 26, and a timing (clock signal) output terminal 27.

Figure 2:
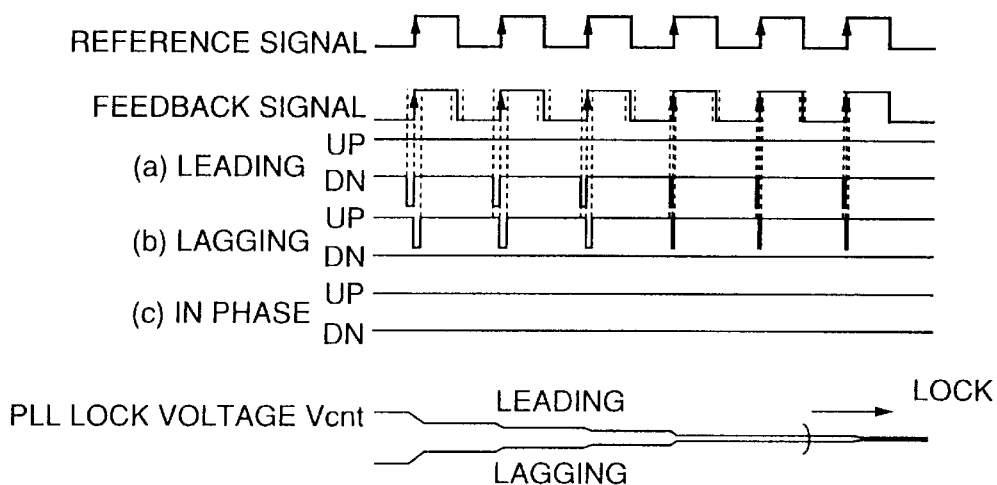
FIG. 2 illustrates operational waveforms of the conventional phase locked loop circuit shown in FIG. 1.

FIG. 2 illustrates operational waveforms of critical nodes of the circuit shown in FIG. 1. The phase comparator block 21 compares a reference input data (an input reference signal) having a reference frequency Fref to a divider output data (a feedback signal) having a divided frequency (Fvco/N) In FIG. 2, it is assumed for reasons of simplicity that these phase comparisons only takes place on the rising edges of the input reference signal and the feedback signal. A phase difference between the input reference signal and the feedback signal determines phase compared outputs of the phase comparator block 21. When the phase of the divider output data leads the phase of the reference input data, the phase comparator block 21 generates a pulse train of negative pulses at the output DN. The output DN is called a pump-down signal. The width of those pulses equals the phase difference between the input reference signal and the feedback signal. See (a) in FIG. 2.

Conversely when the phase of the feedback signal lags that of the input reference signal, the phase comparator block 21 produces a pulse train of negative pulses at the output UP. The output UP is called a pump-up signal. The width of these pulses equals the phase difference between the input reference signal and the feedback signal. See (b) in FIG. 2.

When there is no phase difference between the input reference signal and the feedback signal, no pulse output is produced at either output UP or DN. This case is represented in (c) in FIG. 2.

The phase compared outputs are subsequently supplied to the charge pump block 22'. Depending on the phase compared outputs DN and UP, the charge pump block 22' functions to either charge or discharge an input node of the low-pass filter block 23. The low-pass filter block 23 is charged when the pump-up signal UP is low and the pump-down signal DN is high. Conversely, the low-pass filter block 23 is discharged when the pump-up signal UP is high and the pump-down signal DN is low. When both the pump-up signal UP and the pump-down signal DN are high, the charge pump block 22' is disabled in which case the low-pass filter block 23 is neither charged nor discharged. In this case, the low-pass filter block 23 is isolated from the charge pump block 22' and the phase comparator block 21.

Figure 3:
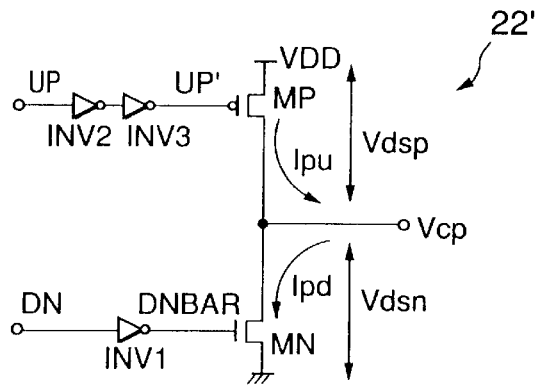
FIG. 3 is a circuit diagram of a conventional charge pump block used in the conventional phase locked loop circuit illustrated in FIG. 1.

Therefore, the charge pump block 221 shown in FIG. 3 is basically a tri-state (charging, discharging or open) switch.

A charge pump output signal of the charge pump block 22' is converted to a DC (direct current) voltage or a control voltage Vcnt by means of the low-pass filter block 23. The low-pass filter block 23 determines the response characteristics of the PLL circuit i.e. a natural frequency $\omega_n$ and a damping factor $\zeta$.

The VCO 24 is supplied with the control voltage Vcnt and produces an output clock signal (a VCO output signal) having a VCO frequency Fvco. The VCO 24 consists of a bias generator 241 and a current controlled oscillator 242. The VCO output signal varies in a range about N*Fref (N is an integer) in response to the control voltage Vcnt. The output clock signal is then frequency divided down by the frequency divider 25 to produce a divided clock signal as the feedback signal having the feedback frequency Ffbk (Ffbk= Fvco/N). Negative feedback operation of the PLL circuit results in the phase difference between the input reference signal and the feedback signal becoming a minimum, the so-called 'phase locked state'.

A conventional charge pump block 22' is shown in FIG. 3. It comprises a PMOS pump UP transistor MP and an NMOS pump DOWN transistor MN. The PMOS pump UP transistor MP has a source connected to VDD while the NMOS pump DOWN transistor MN has a source connected to GND. Both of the transistors MP and MN have drains which are connected together to produce the charge pump output signal depicted at Vcp. A first inverter INv1 provides a necessary inversion of the pump-down signal DN to produce an inverted pump-down signal DNBAR which drives the gate of the NMOS pump DOWN transistor MN. Second and third inverters INV2 and INV3 buffer the pump-up signal UP to produce a buffered pump-up signal UP' which drives the gate of the PMOS pump UP transistor MP.

When the pump-up and the pump-down signals UP and DN from the phase comparator block 21 are low and high, respectively, the PMOS pump UP transistor MP turns ON and delivers a pump UP current +Ipu as the charge pump output signal Vcp. Similarly, when the pump-up signal UP and the pump-down signal DN from the phase comparator block 21 are high and low, respectively, the NMOS pump DOWN transistor MN turns ON and delivers a pump DOWN current –Ipd as the charge pump output signal Vcp.

In the ideal phase phase-locked condition, there would be no phase difference between the input reference signal and the feedback signal in FIG. 1. Hence, both of the pump-up and the pump-down signals UP and DN would remain high, thereby isolating the input node of the low-pass filter block 23 from the phase comparator block 21. However, in reality, finite PLL loop gain results in some phase difference always existing between the input reference signal and the feedback signal. This erroneous phase difference $\Delta\Phi e$ causes the charge pump block 22' to either produce a corrective pump-up signal UP or a corrective pump-down signal DN. While this is the case, the average pump up current Ipu flowing in the PMOS pump UP transistor MP equals the average pump down current Ipd flowing in the NMOS pump DOWN transistor MN. In order to satisfy this condition (Ipu=Ipd at lock), the transistors MP and MN are ratioed proportionally at Vcp=VDD/2.

Figure 4:
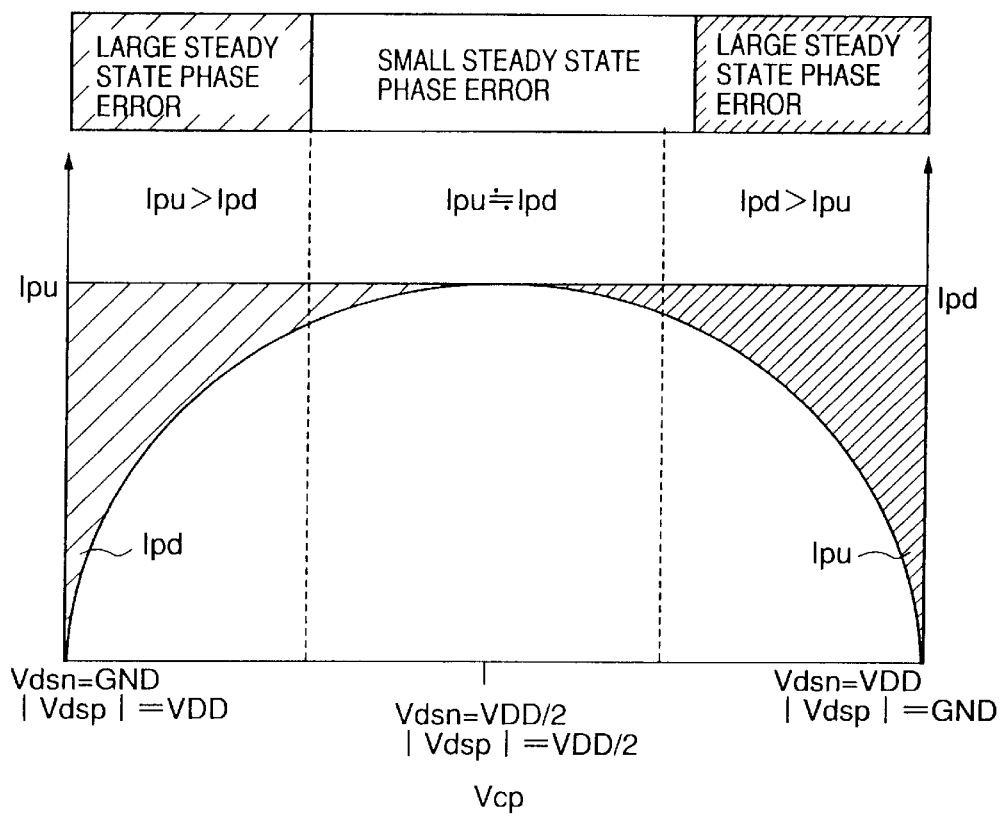
FIG. 4 illustrates the reason whey the conventional phase locked loop circuit of FIG. 1.

FIG. 4 shows how the average pump up current Ipu and the average pump down current Ipd vary as a function of the PLL lock voltage (the charge pump output signal) Vcp. While Ipu=Ipd for Vcp≈VDD/2, the bigger the mismatch between Ipu and Ipd becomes as the PLL lock voltage Vcp moves towards either VDD or GND. The bigger the mismatch in currents, the bigger the phase error offset (or steady state phase error as it's called) required as the input of the phase comparator to satisfy the condition of Ipu=Ipd at phase lock. The range of the PLL lock voltage Vcp depends on the process condition of the chip at the time of manufacture and VCO design. While conventional NMOS input VCOs have a relatively limited lock voltage range, recently proposed complementary type VCOs (both NMOS input and PMOS input) have a much wider lock voltage range. Hence, conventional charge pump circuits used with these type of VCOs would produce even larger steady state phase errors.

Large steady state phase errors cause for example an increase in error bit rate in a clock recovery circuit or increase the skew between two communicating chips (chip 1 manufactured at process condition 1 while chip 2 is manufactured at process condition 2). Furthermore, since most lock detectors use phase differences to detect the locked state, this steady state phase error can cause an erroneous lock detection to occur.

Thus in summary, a phase locked loop circuit is needed which achieves a very small steady state phase error for all values of PLL lock voltage, as mentioned in the preamble of the instant specification.

Figure 5:
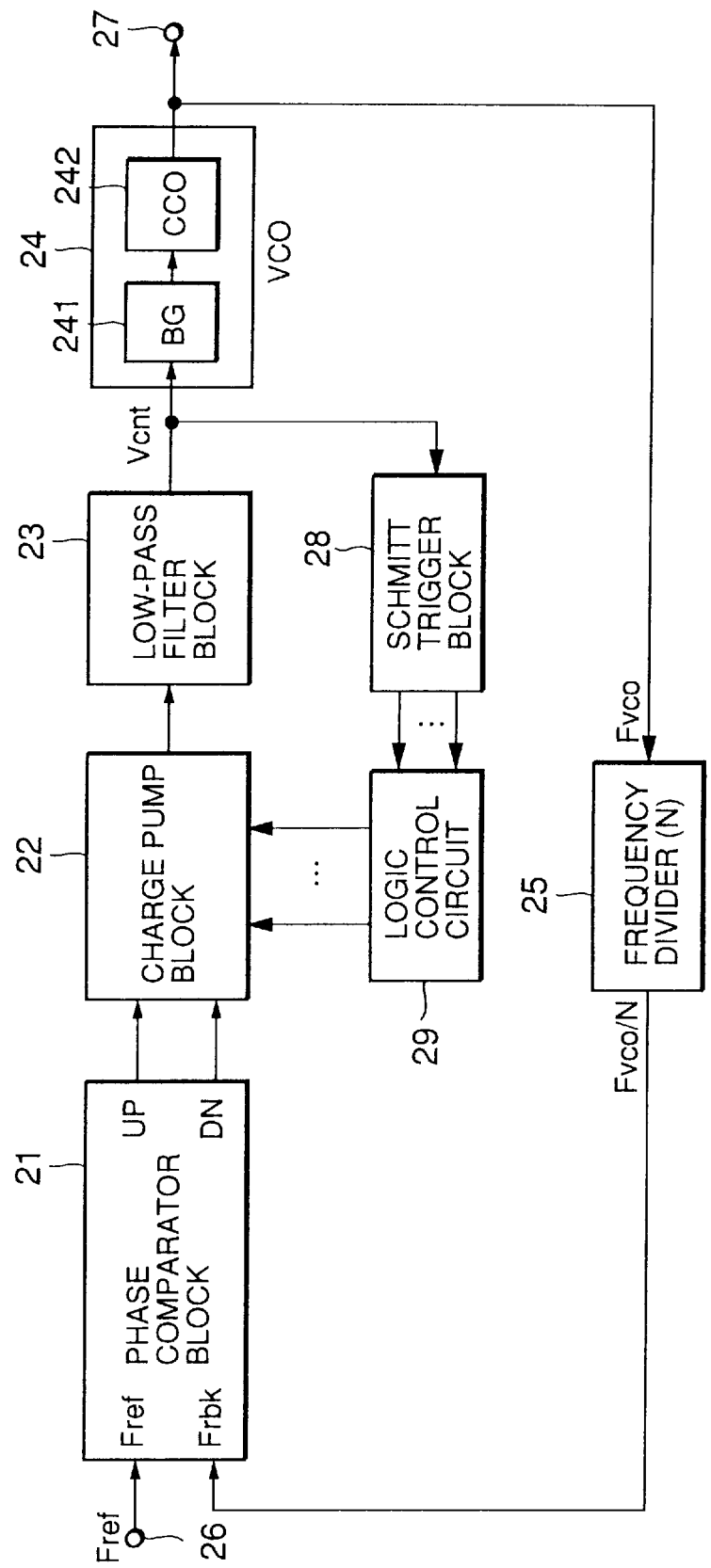
FIG. 5 is a block diagram showing a phase locked loop circuit in accordance with the principles of the present invention.

Referring to FIG. 5, description will proceed to a phase locked loop circuit in accordance with the principles of the present invention. The present invention shown in FIG. 5 guarantees the phase locked loop circuit which uses a Schmitt trigger can achieve a very small steady state phase error over the entire PLL lock voltage range.

The illustrated phase locked loop circuit comprises a phase comparator block 21, a charge pump block 22, a low-pass filter block 23, a voltage controlled oscillator (VCO) 24, a frequency divider 25, a reference input terminal 26, a timing (clock signal) output terminal 27, a Schmitt trigger block 28, and a control logic circuit29.

The phase comparator block 21 consists of at least one phase comparator. Each phase compartor is used for detecting a phase difference between an input reference signal and a feedback signal from the divider 25. The phase difference is produced as phase compared output signals which are supplied to the charge pump block 22.

The charge pump block 22 charges or discharges the low-pass filter block 23 according to the phase compared output signals from the phase comparator block 21.

The low-pass filter block 23 couples an output voltage of the charge pump block 22 to the voltage controlled oscillator 24 and the Schmitt trigger block 28.

The Schmitt trigger block 28 consists of a plurality of Schmitt trigger circuits in the manner which will later become clear. Each Schmitt trigger circuit has the amount of hysteresis which depends on a damping factor $\zeta$ of the PLL circuit as well as temperature and voltage coefficients of a VCO input voltage Vcnt. The hysteresis curve has the midpoint which is set by a current voltage characteristics of the charge pump block 22. The Schmitt trigger block 28 produces outputs which vary in response to the VCO's input voltage and are fed as inputs to the control logic circuit 29.

The control logic circuit 29 is located between the Schmitt trigger block 28 and the charge pump block 22. The control logic circuit 29 produces output signals which vary in response to the output signals from the Schmitt trigger block 28. The output signals from the control logic circuit 29 command the charge pump block 22 to turn ON or OFF as the case may be PMOS pump UP transistors and NMOS pump DOWN transistors.

The voltage controlled oscillator 24 generates a vco output signal whose frequency is determined by the output of the low-pass filter block 23. The VCO output signal is supplied to the frequency divider 25. The voltage controlled oscillator 24 consists of a bias generator (BG) 241 and a current controlled oscillator (CCO) 242.

The frequency divider 25 frequency divides the VCO output signal by a division ratio N. The frequency divider 25 produces a divided signal which is supplied back to the feedback signal of the phase comparator block 21.

Description will proceed to operation of the phase locked loop circuit illustrated in FIG. 5.

At phase lock, a PMOS pump UP transistor in the charge pump block 22 must deliver the same pump UP current (Ipu) to the low-pass filter block 23 as its NMOS pump DOWN counterpart discharges (Ipd). When the PLL lock voltage approaches GND, the drain-source voltage (Vdsn) of the NMOS pump DOWN transistor is reduced while the Vsdp (=−Vdsp) voltage of its PMOS counterpart increases. Hence in order for the NMOS transistor to satisfy the condition of Ipu=Ipd, it must remain ON for a longer time than its PMOS counterpart. Similarly when the PLL lock voltage approaches VDD, the PMOS transistor must remain ON for a longer time than its NMOS counterpart. This difference in ON time can result in a large steady state phase error at the input of the phase comparator block. According to the present invention, the Schmitt trigger block commands the control logic circuit to vary the aspect ratio of the transistors in the charge pump block in response to the PLL lock voltage. Hence the steady state phase error ad the input of the phase comparator block can be significantly reduced.

Figure 6:
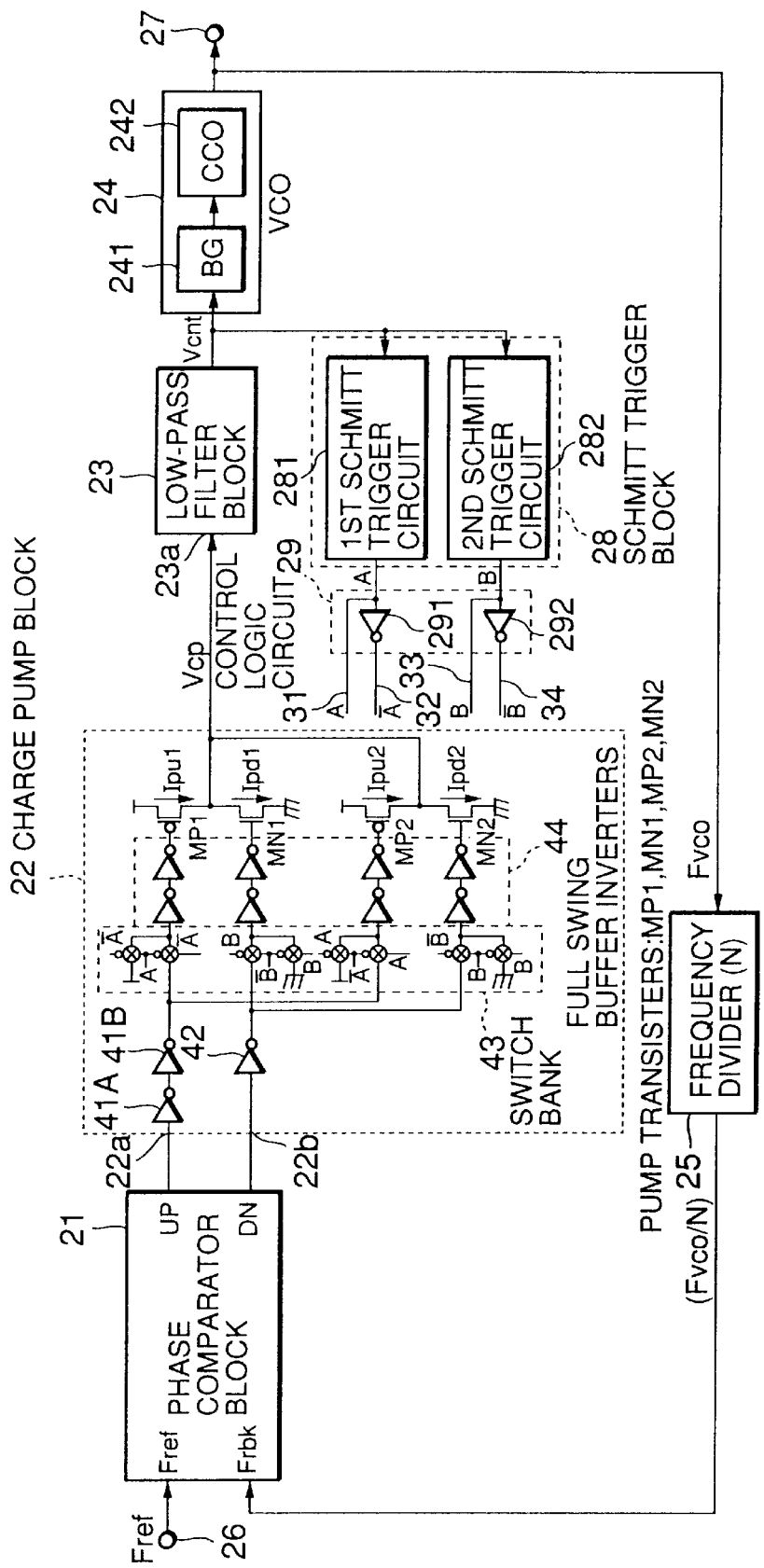
FIG. 6 is a block diagram of a phase locked loop circuit according to a first embodiment of the present invention.

Turning to FIG. 6, description will proceed to a phase locked loop circuit according a first embodiment of the present invention.

The phase comparator block 21 has first and second input terminals Fref and Ffbk and first and second output terminals UP and DN. The first output terminal UP is referred to as a pump up output terminal while the second output terminal DN is referred to as a pump DOWN output terminal. The reference input signal is applied to the first input terminal Fref. A divided clock signal having a divided frequency (Fvco/N) is applied to the second input terminal Ffbk. The phase comparator block 21 functions to generate a pump-up signal at the pump UP output terminal UP when the phase of the reference input signal leads that of the divided clock signal. Similarly, the phase comparator block 21 functions to generate a pump-down signal at the pump DOWN output terminal DN when the phase of the reference input signal lags that of the divided clock signal.

The charge pump block 22 has a pump UP input terminal 21a, a pump DOWN input terminal 22b, and first through fourth control input terminals 31, 32, 33, and 34. The charge pump block 22 functions to charge or discharge an input node 23a of the low-pass filter block 23 depending on the phase difference between the pump-up and the pump-down signals. A charge pump output signal from the charge pump block 22 is filtered by the low-pass filter block 23 to produce a DC (direct current) output voltage or a control voltage Vcnt. The control voltage Vcnt is applied to the input of both Schmitt trigger block 28 and the VCO 24.

Figure 7A:
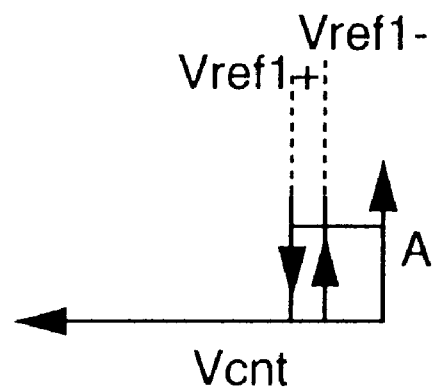
FIGS. 7A and 7B show hysteresis characteristics of first and second Schmitt trigger circuits in a Schmitt trigger block for use in the phase locked loop circuit illustrated in FIG. 6, respectively.
Figure 7B:
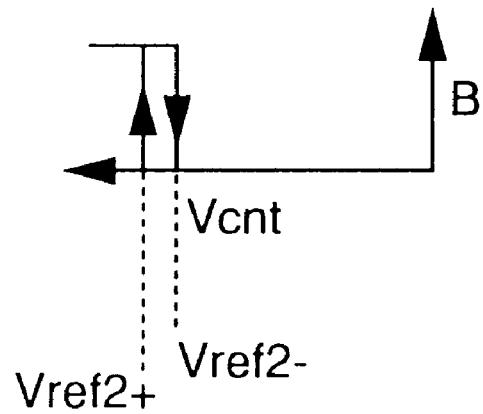

Referring to FIGS. 7A and 7B in addition to FIG. 6, the Schmitt trigger block 28 consists of a first Schmitt trigger circuit 281 and a second Schmitt trigger circuit 282.

The control voltage Vcnt determines a first Schmitt output signal A of the first Schmitt trigger circuit 281. As shown in FIG. 7A, the first Schmitt trigger circuit 281 has a first positive threshold Vref1+ and a first negative threshold voltage Vref1−e. A first threshold voltage Vref1=(Vref1++Vref1−)/2 depends on the current voltage characteristics of MOS transistors MN1 and MP1 in the charge pump block 22. A first threshold difference (Vref1+−Vref1−) depends on the damping factor $\zeta$ of the PLL circuit as well as the temperature and the voltage coefficients of the control voltage Vcnt.

Similarly the control voltage Vcnt determines a second Schmitt output signal B of the second Schmitt trigger circuit 282. As shown in FIG. 7B, the second Schmitt trigger circuit 282 has a second positive thresholds Vref2+ and a second negative threshold voltage Vref2−. A second threshold voltage Vref2=(Vref2++Vref2−)/2 depends on the current voltage characteristics of the MOS transistors MN1 and MP1 in the charge pump block 22. A second threshold difference (Vref2+−Vref2−) depends the damping factor $\zeta$ of the PLL circuit as well as the temperature and the voltage coefficients of the control voltage Vcnt.

Turning back to FIG. 6, the control logic circuit 29 consists of first and second inverters 291 and 292. The first Schmitt output signal A of the first Schmitt trigger circuit 281 defines a first control output signal A which is supplied to an input terminal of the first inverter 291. The output of the first inverter 291 defines a second control output signal $\overline{A}$. The second Schmitt output signal B of the second Schmitt trigger circuit 282 defines a third control output signal B which is supplied to an input terminal of the second inverter 292. The output of the second inverter 292 defines a fourth control output signal $\overline{B}$.

The control voltage Vcnt determines a frequency of the VCO output signal of the VCO 24. The VCO 24 consists of a bias generator (GB) 241 and a current controlled oscillator (CCO) 242. The frequency divider 25 is located between the VCO 24 and the phase comparator block 21. The frequency divider 25 is supplied with the VCO output signal having a VCO frequency Fvco and produces the divided clock signal having the divided frequency (Fvco/N) which is applied to the phase comparator block 21 as the feedback signal.

Figure 8:
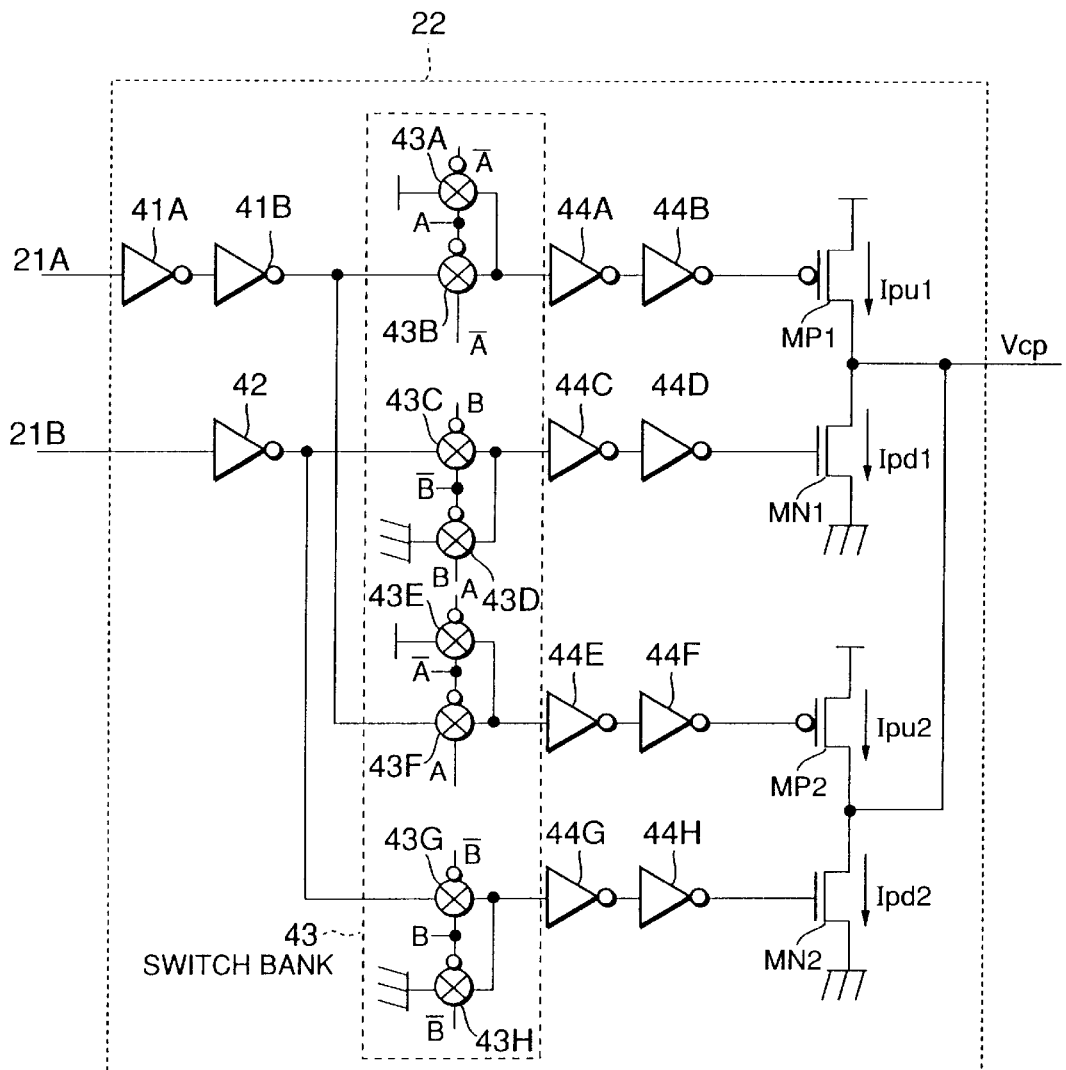
FIG. 8 is a circuit diagram of a charge pump block for use in the phase locked loop circuit illustrated in FIG. 6.

Referring to FIG. 8 in addition to FIG. 6, the charge pump block 22 consists of buffer inverters (41A, 41B), an inverter 42, a switch bank 43 (of first through eighth switches 43A, 43B, 43C, 43D, 43E, 43F, 43G, and 43H), full swing buffer inverters 44 (44A, 44B, 44C, 44D, 44E, 44F, 44G, and 44H), and pump transistors (MP1, MN1, MP2, MN2)

The buffer inverters 41A and 42B buffer the pump-up signal UP from the phase comparator block 21 to the second and the sixth switches 43B and 43F. Similarly, the inverter 42 buffers and provides the necessary inversion of the pump-down signal DN from the phase comparator block 21 to the third and the seventh switches 43C and 43G. The example switch in FIG. 8 consists of an NMOS transistor connected in parallel with a PMOS transistor. To ensure that the gates of the pump transistors MP1, MN1, MP2, MN2 experience a full VDD voltage swing when turned ON, the full swing buffer inverters 44 (44A–44H) are located between the switch bank 43 and the gates of the pump transistors MP1, MN1, MP2, MN2. The first through the fourth control input signals A, B, $\overline{A}$, and $\overline{B}$ from the control logic circuit 29 applied to the gates of the switches 43A–43H determine which switches and hence which pump transistors MP1, MN1, MP2, MN2 are ON at any one time.

When the first switch 43A is ON and the second switch 43B is OFF, a voltage equal to VDD is applied to the gate of the first PMOS pump up transistor MP1 thereby turning it OFF. In contrast when the first switch 43A is OFF and the second switch 43B is ON, the pump-up signal is buffered to the gate of the first PMOS pump UP transistor MNP1. When the pump-up signal goes from a logic high level to a logic low level, the first PMOS pump UP transistor MP1 turns ON charging the input node 23a of the low-pass filter block 23 with a first pump UP current Ipu1. The first pump UP current Ipu1 is plotted in FIG. 9 for variations in the charge pump output voltage Vcp at the input node 23a. The first pump UP current Ipu1 is a maximum for Vcp=|Vdsp|=VDD and equal to zero for Vcp=|Vdsp|=GND.

When the third switch 43C is ON and the fourth switch 43D is OFF, the pump-down signal is inverted and buffered to the gate of the first NMOS pump DOWN transistor MN1. When the pump-down signal goes from a logic high level to a logic low level, the first NMOS pump DOWN transistor MN1 turns ON discharging the input node 23a of the low-pass filter block 23 by a first pump DOWN current Ipd1. The first pump DOWN current Ipd1 is plotted in FIG. 9 for variations in the charge pump output voltage Vcp at the input node 23a. The first pump DOWN current Ipd1 is equal to zero for vcp=Vdsn=GND and a maximum for Vcp=Vdsn=VDD. In contrast when the third switch 43C is OFF and the fourth switch 43D is ON, GND is applied to the gate of the first NMOS pump DOWN transistor MN1 thereby turning it OFF.

When the fifth switch 43E is ON and the sixth switch 43F is OFF, a voltage equal to VDD is applied to the gate of the second PMOS pump up transistor MP2 thereby turning it OFF. In contrast when the fifth switch 43E is OFF and the sixth switch 43F is ON, the pump-up signal is buffered to the gate of the second PMOS pump UP transistor MP2. When the pump-up signal goes from a logic high level to a logic low level, the second PMOS pump UP transistor MP2 turns ON charging the input node 23a of the low-pass filter block 23 with a second pump UP current Ipu2. The second pump UP current Ipu2 is plotted in FIG. 9 for variations in the charge pump output voltage Vcp at the input node 23a. The second pump UP current Ipu2 (<Ipu1) is a maximum for Vcp=|vdsp|=VDD and equal to zero for Vcp=|vdsp|=GND.

When the seventh switch 43G is ON and the eighth switch 43H is OFF, the pump-down signal is inverted and buffered to the gate of the second NMOS pump DOWN transistor MN2. When the pump-down signal goes from a logic high level to a logic low level, the second NMOS pump DOWN transistor MN2 turns ON discharging the input node 23a of the low-pass filter block 23 by a second pump DOWN current Ipd2. The second pump DOWN current Ipd2 is plotted in FIG. 9 for variations in the charge pump output voltage Vcp at the input node 23a. The second pump DOWN current Ipd2 is equal to zero for Vcp=Vdsn=GND and a maximum (Ipd2<Ipd1) for vcp=Vdsn=VDD. In contrast when the seventh switch 43G is OFF and the eighth switch 43H is ON, MND is applied to the gate of the second NMOS pump DOWN transistor MN2 thereby turning it OFF.

Figure 9:
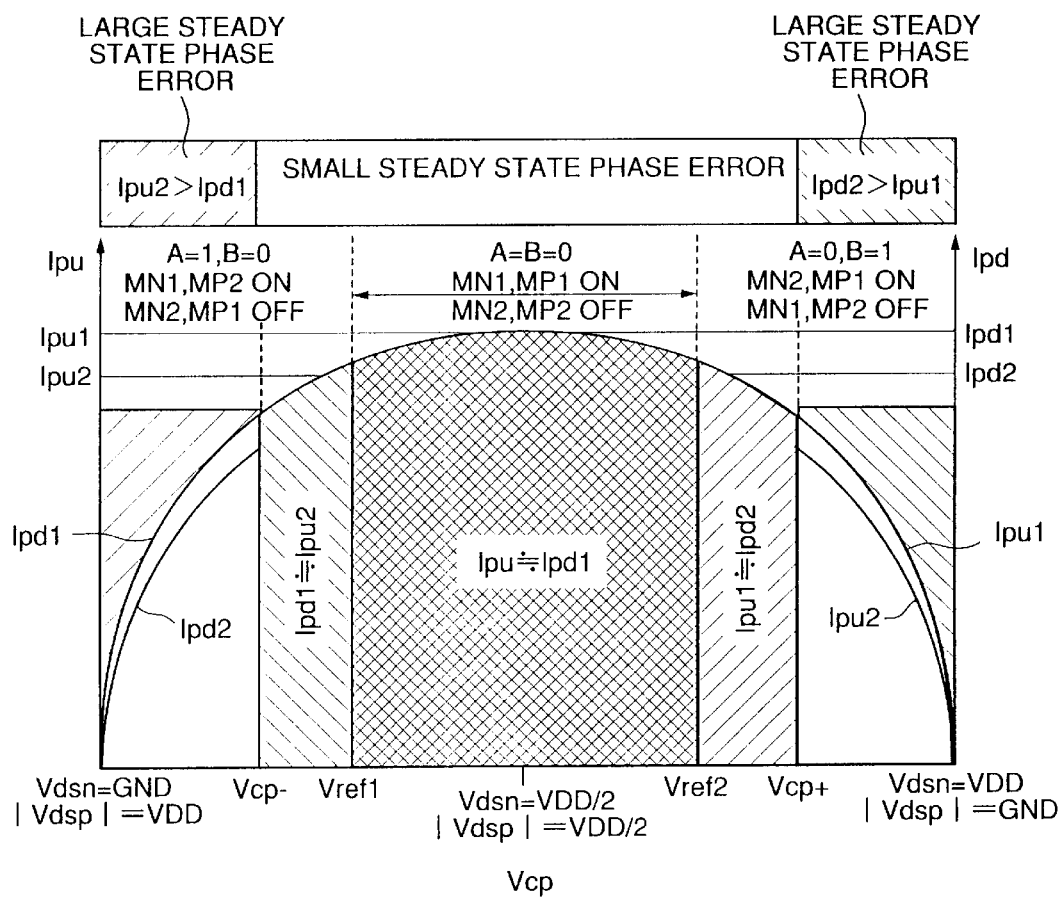
FIG. 9 is a diagram illustrating the basic principle on which the first embodiment in FIG. 6 is based.

The first through the fourth control input signals B, A, $\overline{B}$, $\overline{A}$ vary in response to the PLL lock voltage or the control voltage Vcnt. When Vcp<Vref1, the first Schmitt output signal A of the first Schmitt trigger circuit 281 is high (A=1) while the second Schmitt output signal B of the second Schmitt trigger circuit 282 is low (B=0). In this case, the first, the third, the sixth, and the eighth switches 43A, 43C, 43F, and 43H are ON while the second, the fourth, the fifth, and the seventh switches 43B, 43D, 43E, and 43G are OFF. Hence when the PLL lock voltage Vcnt=Vcp is near GND, the first NMOS pump DOWN transistor MN1 and the second PMOS pump UP transistor MP2 are ON and the second NMPS pump DOWN transistor MN2 and the first PMOS pump UP transistor MP1 are OFF. Consequently, the input node 23a of the low-pass filter block 23 is charged by the second pump UP current Ipu2 and discharged by the first pump DOWN current Ipd1. In FIG. 9, the second pump UP current Ipu2 is clearly greater than the first pump DOWN current Ipd1 for GND≦Vcp<Vcp−. While a PLL which locks in this region has a large steady state phase error, this error is smaller than that in the conventional case since the second pump UP current Ipu2 as opposed to the first pump UP current Ipu1 is compared to the first pump DOWN current Ipd1. For Vcp−≦Vcp≦Vref1+, the first pump DOWN current Ipd1 and the second pump UP current Ipu2 are approximately equal. Consequently in this region, the steady state phase error is small.

When Vref1≦vcp≦Vref2, the first and the second Schmitt output signals A and B of both Schmitt trigger circuits 281 and 282 is low (A=B=0). In this case, the second, the third, the fifth, and the eighth switches 43B, 43C, 43E, and 43H are ON while the first, the fourth, the sixth, and the seventh switches 43A, 43D, 43F, and 43G are OFF. Hence when the PLL lock voltage Vcnt=Vcp is centered around VDD/2, the first NMOS pump DOWN transistor MN1 and the first PMOS pump UP transistor MP1 are ON and the second NMOS pump DOWN transistor MN2 and the second PMOS pump UP transistor MP2 are OFF. Consequently, the input node 23a of the low-pass filter block 23 is charged by the first pump UP current Ipu1 and discharged by the first pump DOWN current Ipd1. In this region of FIG. 9, the first pump UP current Ipu1 and the first pump DOWN current Ipd1 are approximately equal and hence, the steady state phase error is small.

When Vep>Vref2, the first Schmitt output signal A of the first Schmitt trigger circuit 281 is low (A=0) while the second Schmitt output signal B of the second Schmittt trigger circuit 282 is high (B=1). In this case, the second, the fourth, the fifth, and the seventh switches 43B, 43D, 43E, and 43G are ON while the first, the third, the sixth, and the eighth switches 43A, 43C, 43F, and 43H are OFF. Hence when the PLL lock voltage Vcnt=Vcp is near VDD, the first PMOS pump UP transistor MP1 and the second NMOS pump DOWN transistor MN2 are ON and the first NOMS pump DOWN transistor MN1 and the second PMOS pump UP transistor MN2 are OFF. Consequently, the input node 23a of the low-pass filter block 23 is charged by the first pump UP current Ipu1 and discharged by the second pump DOWN current Ipd2. For Vref2≦Vcp≦Vcp+, the first pump UP current Ipu1 and the second pump DOWN current Ipd2 are approximately equal. Hence in this region, the steady state phase error is small. For Vcp+≦Vcp≦VDD, the second pump DOWN current Ipd2 is clearly greater than the first pump UP current Ipu1. While a PLL which locks in this region has a large steady state phase error, this error is smaller than that in the conventional case since the second pump DOWN current Ipd2 as opposed to the first pump DOWN current Ipd1 is compared to the first pump UP current Ipu1.

Figure 14:
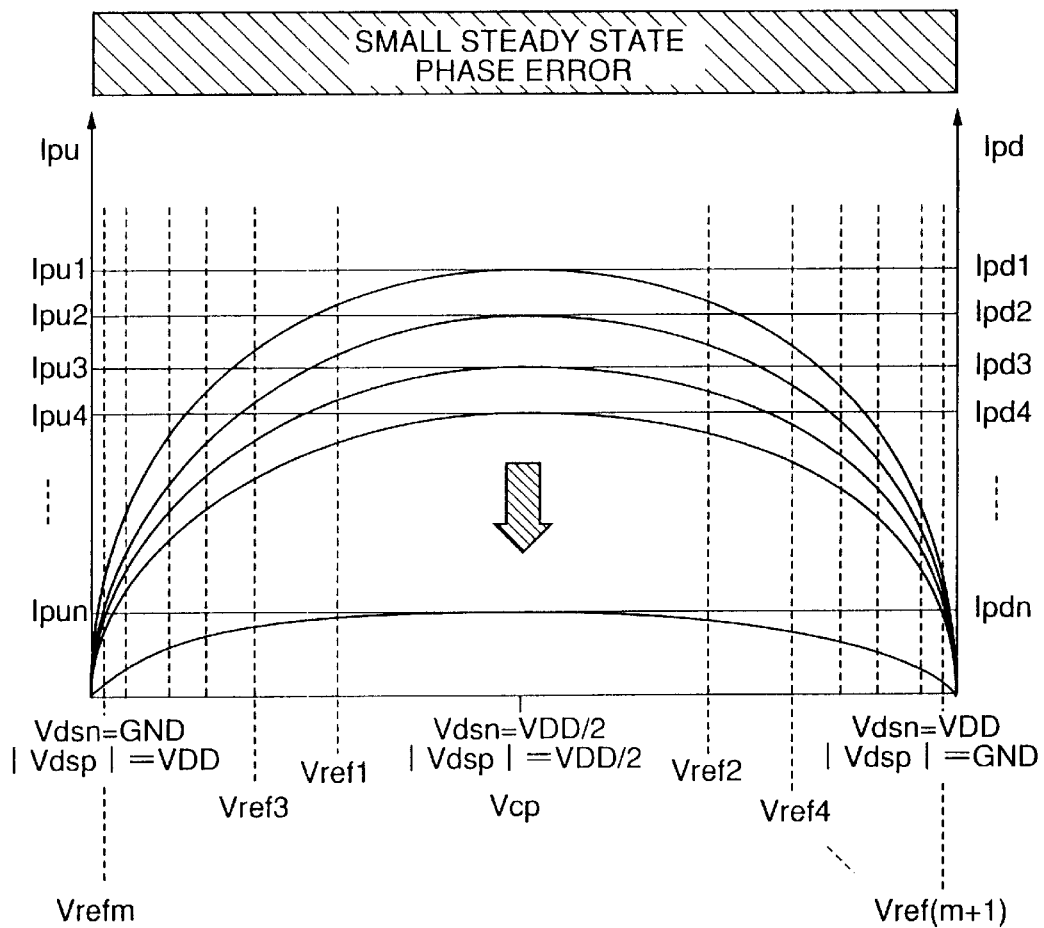
FIG. 14 illustrates graphically the general principle of this invention.

Vcp−≦Vcp≦Vcp+ in FIG. 9 represents the range of lock voltages over which a PLL can achieve a small steady state phase error. Without departing from the scope of the invention, it will be apparent to one skilled in the art that a PLL which achieve a small steady state phase error over a much wider range than that shown in FIG. 7 can be easily achieved. See FIG. 14.

Figure 10:
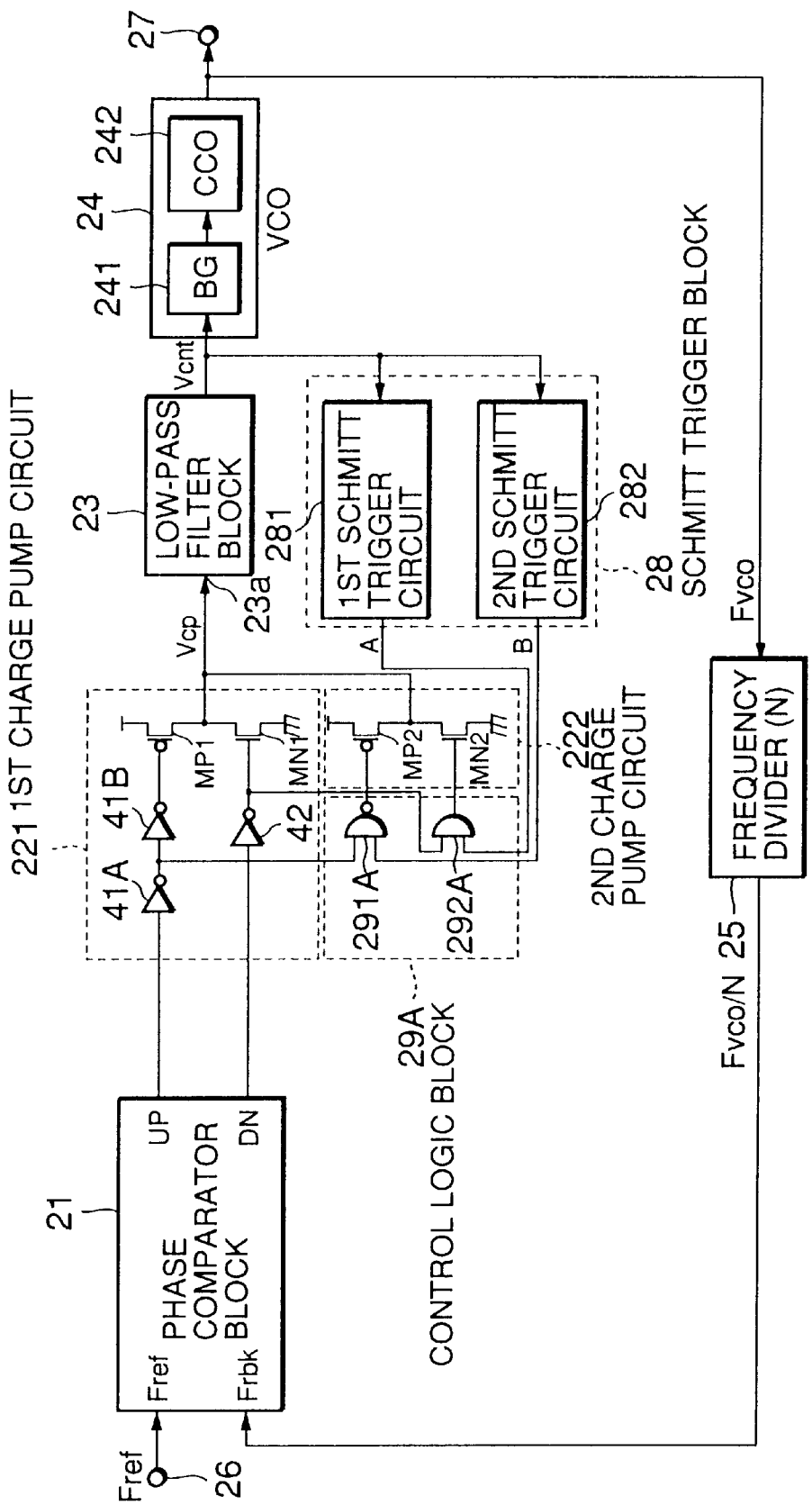
FIG. 10 is a block diagram of a phase locked loop circuit according to a second embodiment of the present invention.

Turning to FIG. 10, description will proceed to a phase locked loop circuit according a second embodiment of the present invention. This embodiment differs from that of FIG. 6 in that the pump transistors in a first charge pump circuit of the charge pump block are ON at all times.

More specifically, the charge pump block consists of the first charge pump circuit depicted at 221 and a second charge pump circuit 222.

The first charge pump circuit 221 consists of the first PMOS pump UP transistor MP1, the first MNOS pump DOWN transistor MN1, the buffer inverters 41A and 41B, and the inverter 42.

The first PMOS pump UP transistor MP1 charges the low-pass filter block 23 when its gate voltage goes from a logic high level to a logic low level. The first PMOS pump UP transistor MP1 has a source connected to a VDD power supply and a drain connected to an input terminal or the input node 23a of the low-pass filter block 23.

The first NMOS pump DOWN transistor MN1 discharges the low-pass filter block 23 when its gate voltage goes from a logic low level to a logic high level. The first NMOS pump DOWN transistor MN1 has a source connected to GND and a drain connected to the input terminal 23a of the low-pass filter block 23.

The buffer inverters 41A and 41B buffer the pump-up signal from the first output terminal UP of the phase comparator block 21 to the gate of the first PMOS pump UP transistor MP1.

The inverter 42 inverts the pump-down signal from the second output terminal DN of the phase comparator block to drive the gate of the first NMOS pump DOWN transistor MN1.

The second charge pump circuit 222 consists of the second PMOS pump UP transistor MP2 and the second NMPS pump DOWN transistor MN2.

The second PMOS pump UP transistor MP2 charges the low-pass filter block 23 when its gate voltage goes from a logic high level to a logic low level. The second EMOS pump UP transistor MP2 has a source connected to the VDD power supply and a drain connected to the input terminal 23a of the low-pass filter block 23.

The second NMOS pump DOWN transistor MN2 discharges the low-pass filter block 23 when its gate voltage goes from a logic low level to a logic high level. The second NMOS pump DOWN transistor MN2 has a source connected to GND and a drain connected to the input terminal 23a of the low-pass filter block 23.

The control logic circuit is modified from that illustrated in FIG. 6 as will later become clear. The control logic circuit is therefore depicted at 29A.

The control logic circuit 29A consists of a 2-input NAND gate 291A and a 2-input AND gate 292A. The NAND gate 291A has a first input terminal connected to an output terminal of the second Schmitt trigger circuit 282 and a second input terminal connected to an inverse signal of the first output terminal UP of the phase comparator block 21. The AND gate 292A has a first input terminal connected to an output terminal of the first Schmitt trigger circuit 282 and a second input terminal connected to the inverse signal of the second output terminal DN of the phase comparator block 21. The NAND gate 291A has an output terminal connected to the gate of the second PMOS pump UP transistor MP2 in the second charge pump circuit 222. The AND gate 292A has an output terminal connected to the gate of the second NMOS pump DOWN transistor MN2 in the second charge pump circuit 222.

Depending on the first and the second Schmitt output signals A and B of the Schmitt trigger block 28, one of the two pump transistors MP2 and MN2 in the second charge pump circuit 222 is turned ON to improve the balance between the MOS transistors MP1 and MN1 in the first charge pump circuit 221. When the PLL lock voltage Vcnt is near GND, the second NMOS pump DOWN transistor MN2 in the second charge pump circuit 222 is turned ON. Similarly when the PLL lock voltage Vcnt is near VDD, the second PMOS pump UP transistor MP2 in the second charge pump circuit 222 is turned ON Hence this embodiment achieves a small steady state phase error without reducing the pump current. In contrast the second embodiment shown in FIG. 6 achieves a small steady state phase error by reducing the pump current.

Figure 11:
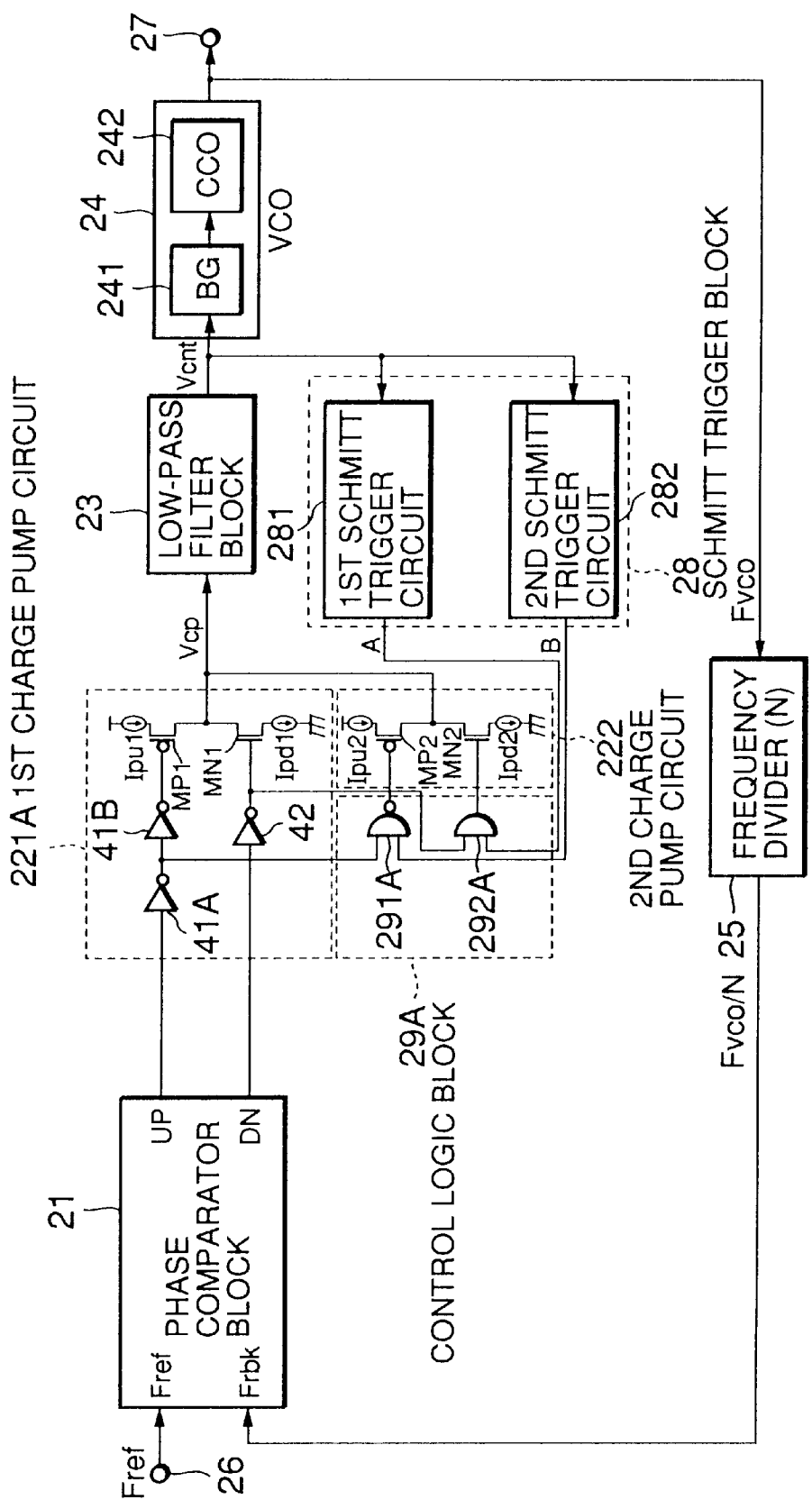
FIG. 11 is a block diagram of a phase locked loop circuit according to a third embodiment of the present invention.

Turning to FIG. 11, description will proceed to a phase locked loop circuit according a third embodiment of the present invention. This embodiment differs from that of FIG. 10 in that current sources are placed between the sources of the pump transistors (NMOS and PMOS) and their respective power supplies (GND and VDD respectively). The first and the second charge pump circuits are therefore depicted at 221A and 222A. This embodiment achieves, with only a slight area overhead, a smaller steady state phase error than the third embodiment shown in FIG. 10.

Figure 12:
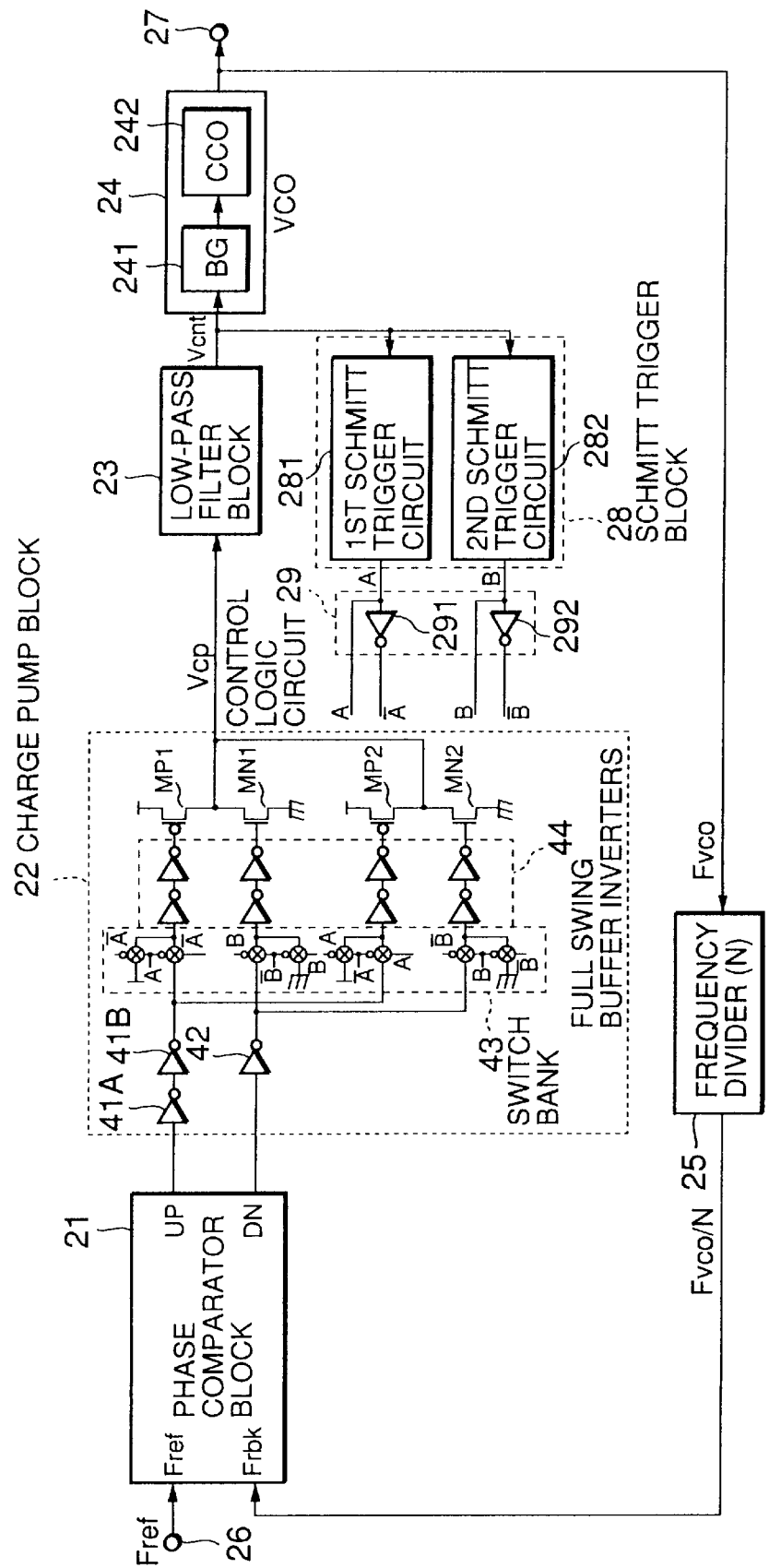
FIG. 12 is a block diagram of the phase locked loop circuit same as that shown in FIG. 6.
Figure 13:
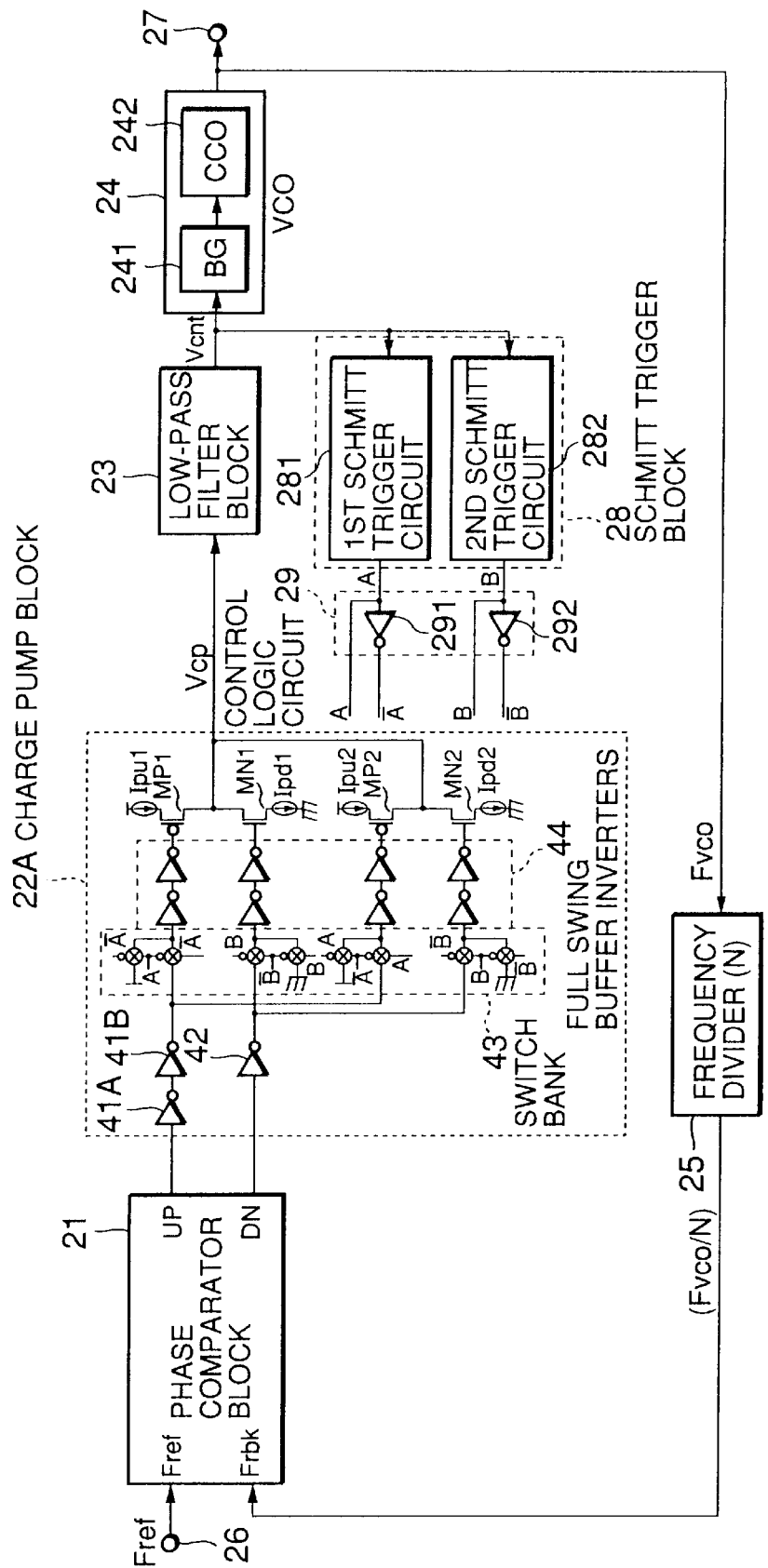
FIG. 13 is a block diagram of a phase locked loop circuit according to a fourth embodiment of the present invention.

The embodiment shown in FIG. 12 (same as that shown in FIG. 6) has already described in detail. A fourth embodiment shown in FIG. 13 differs from that in FIG. 12 in that current sources are placed between the sources of the pump transistors (NMOS and PMOS) and their respective power supplies (GND and VDD respectively). The charge pump block is therefore depicted at 22A. This embodiment achieves, with only a slight area overhead, a smaller steady state phase error than the embodiment shown in FIG. 12.

This invention guarantees that a phase locked loop circuit will achieve a very small steady state phase error irrespective of the PLL lock voltage.

While this invention has thus far been described in conjunction with preferred embodiments thereof, it will now be readily possible for those skilled in the art to put this invention into various other manners. For example, although the frequency divider 25 is located between the VCO 24 and the phase comparator block 21 in the above-mentioned embodiments, depending on the application (e.g. frequency synthesis or clock recovery), a frequency divider may or may not be required in the feedback path between the VCO and the phase comparator block.

What is claimed is:

1. A phase locked loop (PLL) circuit using a Schmitt trigger to achieve a very small steady state phase error, said PLL circuit comprising:
   a phase comparator block for detecting a phase difference between an input reference signal and a feedback signal to produce a phase difference signal indicative of the phase difference;
   a low-pass filter block for producing a control voltage;
   a charge pump block, placed between said phase comparator block and said low-pass filter block, for charging or discharging said low-pass filer block according to the phase difference signal;
   a Schmitt trigger block, connected to said low-pass filter block, consisting of a plurality of Schmitt trigger circuits, each Schmitt trigger circuit having the amount of hysteresis which depends on a damping factor $\zeta$ of the PLL circuit as well as temperature and voltage coefficients of the control voltage, a hysteresis curve having the midpoint which is set by a current voltage characteristics of said charge pump block, said Schmitt trigger block producing Schmitt output signals which vary in response to the control voltage;
   a control logic circuit placed between said Schmitt trigger block and said charge pump block, said control logic circuit producing control output signals which vary in response to the Schmitt output signals, the control output signals commanding said charge pump block to turn ON or OFF;
   a voltage controlled oscillator (VCO), connected to said low-pass filter block, for generating a VCO output signal whose frequency is determined by the control voltage; and
   a frequency divider, placed between said voltage controlled oscillator and said phase comparator block, for frequency dividing the VCO output signal by a division ratio N, said frequency divider producing a divided signal as the feedback signal which is supplied to said phase comparator block.

2. A PLL circuit as claimed in claim 1, wherein said voltage controlled oscillator consists of a bias generator (BG) and a current controlled oscillator (CCO).

3. A PLL circuit as claimed in claim 1, wherein
   said phase comparator block consists of a single phase comparator, said single phase comparator having a first input terminal, a second input terminal, a first output terminal, and a second output terminal;
   said charge pump block consisting of a first charge pump circuit and a second charge pump circuit,
      said first charge pump circuit consisting of
         a first PMOS pump UP transistor which charges said low-pass filter block when its gate voltage goes from a logic high level to a logic low level, whose source is connected to a VDD power supply and whose drain is connected to an input terminal of said low-pass filter block,
         a first NMOS pump DOWN transistor which discharges said low-pass filter block when its gate voltage goes from a logic low level to a logic high level, whose source is connected to GND and whose drain is connected to the input terminal of said low-pass filter block,
         buffer inverters for buffering a signal from the first output terminal of said phase comparator to the gate of said first PMOS pump UP transistor,
         inverter(s) for inverting a signal from the second output terminal of said phase comparator to drive the gate of said first NMOS pump DOWN transistor,
      said second charge pump circuit consisting of
         a second PMOS pump UP transistor which charges said low-pass filter block when its gate voltage goes from a logic high level to a logic low level, whose source is connected to the VDD power supply and whose drain is connected to the input terminal of said low-pass filter block,
         a second NMOS pump DOWN transistor which discharges said low-pass filter block when its gate voltage goes from a logic low level to a logic high level, whose source is connected to GND and whose drain is connected to the input terminal of said low-pass filter block,
   said Schmitt trigger block consisting of a first Schmitt trigger circuit and a second Schmitt trigger circuit,
      said first Schmitt trigger circuit having a first positive threshold at Vref1+ and a first negative threshold at Vref1−, a first threshold difference (Vref1+−Vref1−) depending on the damping factor $\zeta$ of the PLL circuit as well as the temperature and voltage characteristics of the control voltage, a first threshold Vref1=(Vref1++Vref1)−)/2 being determined by current-voltage characteristics of the transistors in said first charge pump circuit, the first threshold Vref1 closer to GND than it is to VDD,
      said second Schmitt trigger circuit having a second positive threshold at Vref2+ and a second negative threshold at Vref2−, a second threshold difference (Vref2+−Vref2−) depending on the damping factor $\zeta$ of the PLL circuit as well as the temperature and voltage characteristics of the control voltage, a second threshold Vref2=(Vref2++vref2−)/2 being determined by current-voltage characteristics of the transistors in said first charge pump circuit, the second threshold Vref2 closer to VDD than it is to GND.

4. A PLL circuit as claimed in claim 3, wherein said control logic circuit consists of a 2-input NAND gate and a 2-input AND gate, said NAND gate having a first input terminal connected to an output terminal of said second Schmitt trigger circuit and a second input terminal connected to an inverse signal of the first output terminal of said phase comparator, said AND gate having a first input terminal connected to an output terminal of said first Schmitt trigger circuit and a second input terminal connected to the inverse signal of the second output terminal of said phase comparator, said NAND gate having an output terminal connected to the gate of said second PMOS pump UP transistor in said second charge pump circuit, said AND gate having an output terminal connected to the gate of said second NMOS pump DOWN transistor in said second charge pump circuit.

5. A PLL circuit as claimed in claim 4, which further comprises current sources between the sources of the pump transistors (NMOS and PMOS) and their respective power-supplies (GND and VDD respectively).

6. A PLL circuit as claimed in claim 3, wherein said charge pump block further comprises a switch bank and full-swing buffer inverters,
   said switch bank comprising a plurality of switches whose gates are controlled by the control output signals of said control logic circuit, said switches controlling which of the PMOS pump UP transistors and the NMOS pump DOWN transistors are ON at any one time,
   said full-swing buffer inverters being placed between the switches and the gates of both PMOS pump UP transistors and NMOS pump DOWN transistors to guarantee that these transistors experience a full VDD logic swing, said control logic circuit having a first input terminal, a second input terminal, a first output terminal, a second output terminal, a third output terminal, and a fourth output terminal, said control logic circuit consisting of a first inverter and a second inverter, said first inverter having an input terminal which is connected to the output terminal of said first Schmitt trigger circuit and to the first output terminal of said control logic circuit, said second inverter having an input terminal which is connected to the output terminal of said second Schmitt trigger circuit and to the third output terminal of said control logic circuit, said first inverter having an output terminal connected to the second output terminal of said control logic circuit, said second inverter having an output terminal connected to the fourth output terminal of said control logic circuit.

7. A PLL circuit as claimed in claim 6, which further comprises current sources between the sources of the pump transistors (NMOS and PMOS) and their respective power-supplies (GND and VDD respectively).

8. A phase locked loop (PLL) circuit using a Schmitt trigger to achieve a very small steady state phase error, said PLL circuit comprising:

a phase comparator block for detecting a phase difference between an input reference signal and a feedback signal to produce a phase difference signal indicative of the phase difference;

a low-pass filter block for producing a control voltage;

a charge pump block, placed between said phase comparator block and said low-pass filter block, for charging or discharging said low-pass filer block according to the phase difference signal;

a Schmitt trigger block, connected to said low-pass filter block, consisting of a plurality of Schmitt trigger circuits, each Schmitt trigger circuit having the amount of hysteresis which depends on a damping factor $\zeta$ of the PLL circuit as well as temperature and voltage coefficients of the control voltage, a hysteresis curve having the midpoint which is set by a current voltage characteristics of said charge pump block, said Schmitt trigger block producing Schmitt output signals which vary in response to the control voltage;

a control logic circuit placed between said Schmitt trigger block and said charge pump block, said control logic circuit producing control output signals which vary in response to the Schmitt output signals, the control output signals commanding said charge pump block to turn ON or OFF;

a voltage controlled oscillator (VCO), connected to said low-pass filter block, for generating a VCO output signal whose frequency is determined by the control voltage; and supplying means, placed between said voltage controlled oscillator and said phase comparator block, for directly supplying, as the feedback signal, the VCO output signal to said phase comparator block.

9. A PLL circuit as claimed in claim 8, wherein said voltage controlled oscillator consists of a bias generator (BG) and a current controlled oscillator (CCO).

10. A PLL circuit as claimed in claim 8, wherein said phase comparator block consists of a single phase comparator, said single phase comparator having a first input terminal, a second input terminal, a first output terminal, and a second output terminal;

said charge pump block consisting of a first charge pump circuit and a second charge pump circuit,
   said first charge pump circuit consisting of
      a first PMOS pump UP transistor which charges said low-pass filter block when its gate voltage goes from a logic high level to a logic low level, whose source is connected to a VDD power supply and whose drain is connected to an input terminal of said low-pass filter block,
      a first NMOS pump DOWN transistor which discharges said low-pass filter block when its gate voltage goes from a logic low level to a logic high level, whose source is connected to GND and whose drain is connected to the input terminal of said low-pass filter block,
      buffer inverters for buffering a signal from the first output terminal of said phase comparator to the gate of said first PMOS pump UP transistor,
      inverter (s) for inverting a signal from the second output terminal of said phase comparator to drive the gate of said first NMOS pump DOWN transistor,
   said second charge pump circuit consisting of
      a second PMOS pump UP transistor which charges said low-pass filter block when its gate voltage goes from a logic high level to a logic low level, whose source is connected to the VDD power supply and whose drain is connected to the input terminal of said low-pass filter block,
      a second NMOS pump DOWN transistor which discharges said low-pass filter block when its gate voltage goes from a logic low level to a logic high level, whose source is connected to GND and whose drain is connected to the input terminal of said low-pass filter block, said Schmitt trigger block consisting of a first Schmitt trigger circuit and a second Schmitt trigger circuit,
   said first Schmitt trigger circuit having a first positive threshold at Vref1+ and a first negative threshold at Vref1−, a first threshold difference (Vref1+−Vref1−) depending on the damping factor $\zeta$ of the PLL circuit as well as the temperature and voltage characteristics of the control voltage, a first threshold Vref1=(Vref1++Vref1−)/2 being determined by current-voltage characteristics of the transistors in said first charge pump circuit, the first threshold vref1 closer to GND than it is to VDD,
   said second Schmitt trigger circuit having a second positive threshold at Vref2+ and a second negative threshold at Vref2−, a second threshold difference (Vref2+−Vref2−) depending on the damping factor $\zeta$ of the PLL circuit as well as the temperature and voltage characteristics of the control voltage, a second threshold Vref2=(Vref2++Vref2−)/2 being determined by current-voltage characteristics of the transistors in said first charge pump circuit, the second threshold Vref2 closer to VDD than it is to GND.

11. A PLL circuit as claimed in claim 10, wherein said control logic circuit consists of a 2-input NAND gate and a 2-input AND gate, said NAND gate having a first input terminal connected to an output terminal of said second Schmitt trigger circuit and a second input terminal connected to an inverse signal of the first output terminal of said phase comparator, said AND gate having a first input terminal connected to an output terminal of said first Schmitt trigger circuit and a second input terminal connected to the inverse signal of the second output terminal of said phase comparator, said NAND gate having an output terminal connected to the gate of said second PMOS pump UP transistor in said second charge pump circuit, said AND gate having an output terminal connected to the gate of said second NMOS pump DOWN transistor in said second charge pump circuit.

12. A PLL circuit as claimed in claim 11, which further comprises current sources between the sources of the pump transistors (NMOS and PMOS) and their respective power-supplies (GND and VDD respectively).

13. A PLL circuit as claimed in claim 10, wherein
said charge pump block further comprises a switch bank and full-swing buffer inverters,
said switch bank comprising a plurality of switches whose gates are controlled by the control output signals of said control logic circuit, said switches controlling which of the PMOS pump UP transistors and the NMOS pump DOWN transistors are ON at any one time,
said full-swing buffer inverters being placed between the switches and the gates of both PMOS pump UP transistors and NMOS pump DOWN transistors to guarantee that these transistors experience a full VDD logic swing,
said control logic circuit having a first input terminal, a second input terminal, a first output terminal, a second output terminal, a third output terminal, and a fourth output terminal, said control logic circuit consisting of a first inverter and a second inverter, said first inverter having an input terminal which is connected to the output terminal of said first Schmitt trigger circuit and to the first output terminal of said control logic circuit, said second inverter having an input terminal which is connected to the output terminal of said second Schmitt trigger circuit and to the third output terminal of said control logic circuit, said first inverter having an output terminal connected to the second output terminal of said control logic circuit, said second inverter having an output terminal connected to the fourth output terminal of said control logic circuit.

14. A PLL circuit as claimed in claim 13, which further comprises current sources between the sources of the pump transistors (NMOS and PMOS) and their respective power-supplies (GND and VDD respectively).

* * * * *

UNITED STATES PATENT AND TRADEMARK OFFICE
CERTIFICATE OF CORRECTION

PATENT NO : 6,043,695
DATED : March 28, 2000
INVENTOR(S) : Eugene O'Sullivan

It is certified that error appears in the above-identified patent and that said Letters Patent is hereby corrected as shown below:

In Column 13, line 20, please change "filer" to "filter."

In Column 15, line 45, please change "file" to "filter."

Signed and Sealed this

Sixth Day of March, 2001

Attest:

NICHOLAS P. GODICI

Attesting Officer

Acting Director of the United States Patent and Trademark Office